US009761751B2

(12) United States Patent
Klipstein (10) Patent No.: US 9,761,751 B2
(45) Date of Patent: Sep. 12, 2017

(54) SEMICONDUCTOR BARRIER PHOTO-DETECTOR

(71) Applicant: Semi Conductor Devices, Haifa (IL)

(72) Inventor: Philip Klipstein, Zikhron Ya'akov (IL)

(73) Assignee: Semi Conductor Devices, Haifa (IL)

( * ) Notice: Subject to any disclaimer, the term of this patent is extended or adjusted under 35 U.S.C. 154(b) by 0 days.

(21) Appl. No.: 15/454,294

(22) Filed: Mar. 9, 2017

(65) Prior Publication Data
US 2017/0179327 A1    Jun. 22, 2017

Related U.S. Application Data

(63) Continuation of application No. 14/246,322, filed on Apr. 7, 2014, now Pat. No. 9,627,563.

(30) Foreign Application Priority Data

Apr. 22, 2013 (IL) .......................................... 225872

(51) Int. Cl.
*H01L 31/0352* (2006.01)
*H01L 31/11* (2006.01)
(Continued)

(52) U.S. Cl.
CPC .......... *H01L 31/11* (2013.01); *H01L 27/1443* (2013.01); *H01L 31/03046* (2013.01);
(Continued)

(58) Field of Classification Search
CPC .................. H01L 31/03046; H01L 31/035209
See application file for complete search history.

(56) References Cited

U.S. PATENT DOCUMENTS 5,021,863 A    6/1991    Yokoyama
6,635,907 B1    10/2003    Nguyen
(Continued)

FOREIGN PATENT DOCUMENTS

EP    1 642 345    4/2006
EP    1 755 173    2/2007
(Continued)

OTHER PUBLICATIONS

Israeli Office Action dated Nov. 24, 2013.
(Continued)

*Primary Examiner* — Marcos D Pizarro
*Assistant Examiner* — Christopher M Roland
(74) *Attorney, Agent, or Firm* — Haug Partners LLP; William S. Frommer (57) ABSTRACT

The present invention discloses a photo-detector comprising: an n-type photon absorbing layer of a first energy bandgap; a middle barrier layer, an intermediate layer is a semiconductor structure; and a contact layer of a third energy bandgap, wherein the layer materials are selected such that the first energy bandgap of the photon absorbing layer is narrower than that of said middle barrier layer; wherein the material composition and thickness of said intermediate layer are selected such that the valence band of the intermediate layer lies above the valence band in the barrier layer to create an efficient trapping and transfer of minority carriers from the barrier layer to the contact layer such that a tunnel current through the barrier layer from the contact layer to the photon absorbing layer is less than a dark current in the photo-detector and the dark current from the photon-absorbing layer to said middle barrier layer is essentially diffusion limited and is due to the unimpeded flow of minority carriers, thus reducing generation-recombination (GR) noise of the photo-detector. The principles of the
(Continued)

present invention also apply to inverted polarity structures of the form pBp in which all the doping polarities and band alignments described above are reversed.

18 Claims, 7 Drawing Sheets

(51) Int. Cl.
*H01L 27/144* (2006.01)
*H01L 31/0304* (2006.01)

(52) U.S. Cl.
CPC ............ *H01L 31/035209* (2013.01); *H01L 31/035236* (2013.01)

(56) References Cited

U.S. PATENT DOCUMENTS

| | | |
|---|---|---|
| 7,737,411 B2 | 6/2010 | Gunapala et al. |
| 7,795,640 B2 | 9/2010 | Klipstein |
| 8,004,012 B2 | 8/2011 | Klipstein |
| 8,835,979 B1 | 9/2014 | De Lyon |
| 2003/0178699 A1 | 9/2003 | Nakazato et al. |
| 2009/0256231 A1 | 10/2009 | Klipstein |
| 2010/0072514 A1 | 3/2010 | Ting et al. |
| 2011/0095334 A1 | 4/2011 | Scott |
| 2011/0156097 A1 | 6/2011 | Maimon |
| 2011/0291158 A1 | 12/2011 | Ogura et al. |
| 2012/0280350 A1 | 11/2012 | Smith |
| 2013/0341594 A1 | 12/2013 | Mohseni |
| 2014/0191195 A1 | 7/2014 | Sundaram |
| 2014/0374701 A1 | 12/2014 | Wei |
| 2015/0311375 A1 | 10/2015 | Shen |

FOREIGN PATENT DOCUMENTS

| | | |
|---|---|---|
| EP | 2 249 400 | 11/2010 |
| WO | WO 2005/004243 | 1/2005 |

OTHER PUBLICATIONS

Israeli Office Action dated Aug. 19, 2014.

Myers, S., et al. 2009. "The effect of absorber doping on electrical and optical properties of nBn-based type-II InAs/GaSb strained layer superlattice infrared detectors". Applied Physics Letters, 95: 121110-1-12110-3.

Klipstein, P. C., et al. 2011. "MWIR InAsSb XBnn detector (bariode) arrays operating at 150K". Proceedings of Infrared Technology and Applications, XXXVII, SPIE 8012: 8012-24.

Steenbergen, E. H., et al. 2011. "Significantly improved minority carrier lifetime observed in a long-wavelength infrared III-V type-II superlattice comprised of InAs/InAsSb". Applied Physics Letters, 99: 251110-1-251110-3.

Olson, B. V., et al., Poster at MIOMD conference, Chicago, Sep. 4-7, 2012.

Umana-Membreno, G. A., et al. Workbook of II-VI Workshop, Seattle, Nov. 27-29, 2012: 154.

Klin, O., et al. 2009. "Progress with Antimonide Based Detectors at SCD", Proceedings of Infrared Technology and Applications, XXXV, SPIE 7298: 72980G-72980G.

Vurgaftman, I., et al. 2001. "Band parameters for III-V compound semiconductors and their alloys". Journal of Applied Physics, 89(11): 5815-5857.

Figs. 1a-1d
GENERAL ART

Fig. 3B
GENERAL ART

SEMICONDUCTOR BARRIER PHOTO-DETECTOR

This is a continuation of application Ser. No. 14/246,322, filed Apr. 7, 2014, which is entitled to the priority filing date of Israel application number 225872, filed on Apr. 22, 2013, the entirety of which is incorporated herein by reference.

TECHNOLOGICAL FIELD

The present invention relates to photo-detectors for sensing light radiation. More particularly, the present invention relates to a barrier photo-detector structure, in which the level of the dark current is significantly reduced, therefore improving the signal-to noise ratio.

BACKGROUND

References considered to be relevant as background to the presently disclosed subject matter are listed below:
 1. U.S. Pat. No. 8,004,012 which share the inventors and the assignee of the present patent application
 2. "The effect of absorber doping on electrical and optical properties on nBn based type-II InAs/GaSb strained layer superlattice infrared detectors" by S. Mysers, E. Plis, A Khoshakhlagh, H S Kim, Y Sharma, R Dawson, S Krishna and A Gin, Applied Physics Letters 95, 121110 (2009)
 3. U.S. Pat. No. 7,795,640 which share the inventors and the assignee of the present patent application Acknowledgement of the above references herein is not to be inferred as meaning that these are in any way relevant to the patentability of the presently disclosed subject matter.

Photodiodes are widely used for sensing light radiation. There are many applications in which the level of the light which is required to be sensed is very low, and therefore the sensitivity of said photodiodes is acritical requirement.

It is well known in the art that the signal-to-noise ratio which can be obtained from photodiodes (and from many other electronic components) is limited by the level of the "thermal noise", which in turn is related to the temperature of the component. The term "dark current" is commonly used in the art to define the current flowing in a photodiode during a total dark condition. The signal-to-noise ratio in infra-red photodiodes is conventionally improved by cooling the component, in many cases down to very low temperatures close to 77 K, or even lower. The means for cooling and maintaining such a low temperature in photodiodes, however, are cumbersome and expensive, and in any case can reduce the noise down to a limited value.

The dark current is generally composed of two main components. The first component, hereinafter referred to as "the diffusion dark current" is due to the thermal excitation of carriers across the complete energy bandgap of the photodiode sensing material. As said, the level of this current can be reduced by means of cooling the component. The second component affecting the level of the dark current is known as the "Generation-Recombination" current (hereinafter "G-R dark current"). The level of the G-R dark current can also be reduced by cooling, but at a slower rate of reduction to with temperature. At low temperatures, where the level of the diffusion dark current is reduced sufficiently, the G-R dark current generally becomes the most dominant component of the dark current. There have been made many efforts in trying to reduce the level of the thermal noise. However, there are not known many of such efforts for reducing the G-R current.

The maximum operating temperature of a solid state infrared detector is usually determined by its dark current, which increases exponentially with temperature. In standard mid-wave infrared (MWIR) photodiodes operating under conditions of background-limited performance (BLIP), this dark current is usually produced by so called generation-recombination (G-R) centers (also known as Shockley-Read-Hall traps) in the depletion region of the device. A reverse bias applied to the diode activates the dark current for these G-R centers, which provide energy levels close to the middle of the bandgap. As a result, the amount of thermal energy needed to excite an electron out of the valence band or into the conduction band is approximately halved. Electron-hole pairs are generated that are immediately removed by the electric field of the depletion region.

GENERAL DESCRIPTION

Figures 1A, 1B, 1C, 1D:
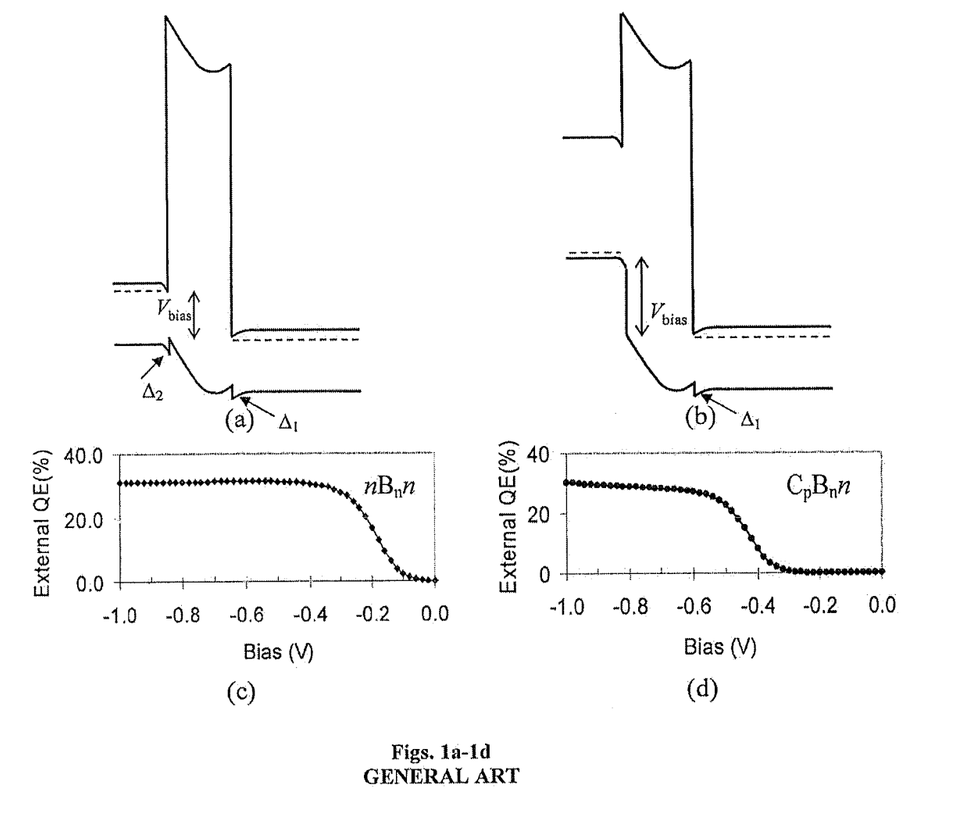
FIGS. 1a-1b show exemplary energy band diagrams of a standard $nB_nn$ photo-detector and $C_pB_nn$ photo-detector respectively.
FIGS. 1c-1d show an external Quantum Efficiency (QE) plot for devices with each of the energy band diagrams of FIGS. 1a-1b respectively.

The nBn photo-detector is a class of midwave infrared photo-detector developed as an alternative to many of those photo-detectors currently incorporated into infrared detector systems. The nBn photo-detector architecture specifies an n-type absorption layer, a Barrier layer, and an n-type contact layer. The barrier layer is constrained to have both a negligible valence band energy offset with the absorption layer, which allows the free passage of minority carrier holes, and a large conduction band energy offset with the absorption layer, which blocks the flow of majority carrier electrons. FIGS. 1a and 1c are a band diagram and its corresponding external quantum efficiency respectively showing the principle of operation of an $nB_nn$ photo-detector as described for example in Reference [1] sharing the inventors and the assignee of the present patent application. For the sake of comparison, FIGS. 1b and 1d are a band diagram and its corresponding external quantum efficiency respectively showing the principle of operation of a $C_pB_nn$ photo-detector as described for example in Reference [3] sharing the inventors and the assignee of the present patent application. Both band diagrams are those of a heterostructure device, in which no depletion layer exists in any active narrow-bandgap region. In both cases (FIGS. 1a and 1b), the n- or p-type semiconductor on the more negative side of the barrier constitutes a contact layer for biasing the device, while the n-type narrow-bandgap semiconductor on the more positive side of the barrier is a photon-absorbing layer whose thickness should be comparable to the absorption length of light in the device, typically several microns. In FIGS. 1b and 1d, $C_p$ and $B_n$ stand for p-type contact and n-type barrier layers, and n for an n-type narrow-bandgap photon-absorbing layer. In an $nB_nn$ device, n also stands for an n-type narrow-bandgap contact layer. The barrier in both the $nB_nn$ and $C_pB_nn$ devices contains n-type doping, which is tailored to ensure that the bands in the narrow-bandgap photon-absorbing layer are flat, right up to the barrier, or else contain a narrow accumulation layer immediately next to the barrier. This is achieved, regardless of the level of n-type doping in the photon-absorbing layer, which should ideally be kept low to ensure good optical properties. Band bending in the contact layer is due to electron accumulation close to the barrier in the case of the $nB_nn$ device and due to depletion in the case of the $C_pB_nn$ device. The bands in the photon absorbing layer are flat at the maximum operating bias but a small accumulation layer of electrons forms close to the barrier layer at lower bias. Because there is no depletion, the G-R contribution to the dark current from the photon-absorbing layer is totally suppressed. The dark current is then limited to the diffusion contribution, which varies typically as $\sim T^s e^{-E_{diff}/k_B T}$, in which $E_{diff}$ is roughly equal to the zero temperature semiconductor bandgap and s~3. Although the barrier layer is depleted and contains an electric field, it has a negligible G-R contribution to the dark current because its bandgap is large and ideally more than twice that of the photon absorbing layer. The G-R contribution to the dark current is thus essentially totally suppressed by ensuring that the bands in the narrow bandgap photon absorbing layer are flat or accumulated and that all depletion is confined to a wide bandgap barrier layer and in some cases also to a negatively biased contact layer.

The heterojunctions between the barrier layer and the two n-type layers in an $nB_n n$ device are ideally such that all of the bandgap difference appears in the conduction band offsets. However, there sometimes remain residual offsets in the valence band. As clearly shown in FIG. 1a, $\Delta_1$ indicates the valence band offset between the barrier layer and the photon-absorbing layer and $\Delta_2$ is the valence band offset between the contact-layer and the barrier layer. It should be understood that the requirement of approximate valence band alignment in the heterojunctions imposes a constraint on the type of alloy materials and compositions used in the n-type layers and in the barrier layer. This requirement can limit the device to only certain infrared wavelengths when $InAs_{1-x}Sb_x$ lattice matched to a suitable substrate is used for the photon absorbing layer, e.g. roughly 3.1 μm (x=0 with InAs substrate) and 4.1 μm cutoff wavelengths (x=0.09 with GaSb substrate). Utilizing compositions that lead to a potential barrier in the valence band impedes the transport process of the minority carriers (holes) through the barrier layer. The resulting hole traps impede the minority carrier transport, and can degrade the performance of the detector. For example, a valence band offset, such as $\Delta_2$ in FIG. 1a can impede minority carrier (hole) flow at low biases and trap the minority carriers between the contact and barrier layers, constituting a potential source of noise and potentially also reducing the Quantum Efficiency of the detector. For the sake of comparison, in the configuration of the $C_p B_n n$ device illustrated in FIG. 1b, $\Delta_2$ does not exist and therefore holes can travel across the barrier layer without being trapped. However, due to the band alignment, the operating bias of a $C_p B_n n$ is generally higher than the operating bias of an $nB_n n$ device. For example, an $InAs_{1-x}Sb_x C_p B_n$ device grown lattice matched to GaSb has an operating bias about 0.3V higher than that of an equivalent $InAs_{1-x}Sb_x nB_n n$ device as described for example in P. C. Klipstein et al, Proceedings of Infrared Technology and Applications XXXVII, SPIE 8012, 8012-24 (2011). Therefore, from the point of view of operating bias, the $nB_n n$ structure configuration is preferable over the $C_p B_n n$ device.

As described above, in the $nB_n n$ structure configuration, a potential barrier at the valence band impedes the minority hole transport. Furthermore, the larger the value of $\Delta_2$, the higher the probability of tunneling through the barrier layer that can lead to an increased dark current and also the greater the probability of positive charge storage in the barrier layer.

Generally, after growth, the wafer is etched into a mesa structure, after which the sides are passivated with a suitable chemical treatment and/or with the application of a suitable insulating or dielectric layer and electrical contacts are then applied (though vias opened up in the insulating or dielectric layer). The depth of the mesa can vary but it should be etched at least up to the beginning of the barrier layer (which is fully depleted and therefore insulating) to provide suitable isolation between the mesa and other devices. The passivation performs one or more of the following roles: (i) protection of any exposed surfaces from attack by oxygen (especially those of Aluminium containing compounds such as $AlSb_{1-y}As_y$ barrier layer) (ii) controlling the surface potential of any exposed surfaces (to avoid surface accumulation or inversion, which would lead, for example, to shorting between neighbouring devices). Moreover, a Focal Plane Array (FPA) may be produced in which each pixel is made up out of detector sub-units with each sub-unit containing an $nB_n n$ or $C_p B_n n$ structure. It should be understood that their higher operating bias may limit the range of possible readout integrated circuits (ROICs) to which an array of $InAs_{1-x}Sb_x C_p B_n n$ devices could be bonded in order to make an FPA detector. Bonding is often performed using Indium bumps or pillars to connect a pixel on the ROIC with a pixel on the detector array. The space between the ROIC and the detector array may be filled with glue in order to make the whole structure more robust for withstanding any stresses during a polishing process to remove all or most of the substrate.

The barriers, $\Delta_1$ and $\Delta_2$ can be reduced essentially to zero by fabricating the photo-detector with InAs/GaSb type II superlattice materials and by appropriately choosing the correct aluminium and arsenic concentration in a lattice matched $Ga_{1-x}Al_xSb_{1-y}As_y$ barrier. Reference [2] describes a type-II superlattice based nBn device having n-type photon absorbing and contact layers made of $InAs_{10}/GaSb_{10}$ type-II superlattice materials surrounding a p-type barrier layer made of $Al_{0.2}Ga_{0.8}Sb$ and a GaSb spacer layer.

However, if type II superlattice materials are used to fabricate the photo-detector, the hole diffusion length is expected to be very small due to the narrow width of the first heavy hole miniband of the superlattice as described for example in Olson et al, Poster at MIOMD conference, Chicago, 4-7 Sep. 2012; Umana Membrano et al, Workbook of II-VI Workshop, Seattle, 27-29 Nov. 2012. Therefore the Quantum Efficiency (QE) may be depressed due to holes recombining in the photon absorbing layer before they can reach the electric field in the depletion region of the barrier.

Another way to reduce the valence band offsets is to provide a detector comprising inter alia a barrier layer comprising a concentration gradient as described for example in U.S. Pat. No. 7,737,411. In this case. $AlSb_{1-y}As_y$ is used in which the value of y varies from one side of the barrier layer to the other. Since the lattice constant is in also changing with y, this solution has a poor lattice matching with the rest of the structure and may suffer from poor crystalline quality and associated defects which degrade performance.

The present invention solves the problem associated with the valence band offsets $\Delta_1$ and $\Delta_2$ by providing an intermediate layer located between the contact layer is and the barrier layer. The novel configuration of the photo-detector comprising inter alia the intermediate layer enables an efficient transfer of the minority carriers to the contact layer without blockage. The configuration of the layer (e.g. the material composition, the thickness) is selected such that efficient transfer is achieved. The intermediate layer is a pseudomorphic semiconductor structure having a bandgap. In some embodiments, the intermediate layer is made entirely of a semiconducting material.

The present invention provides an intermediate layer between the contact layer and the barrier layer of an nBn, pBn, nBp or pBp photo-detector structure.

Therefore, according to a broad aspect of the present invention, there is provided a photo-detector comprising: an n-type photon absorbing layer of a first energy bandgap; a doped middle barrier layer, an intermediate layer having a second energy bandgap and an n-type contact layer of a third energy bandgap. The layer materials are selected such that at least the first and third energy bandgaps of the photon absorbing and contact n-type layers are narrower than that of the middle barrier layer. The material composition and thickness of the intermediate layer are selected such that the valence band of the intermediate layer lies above the valence band in the barrier layer to create an efficient trapping and transfer of minority carriers from the barrier layer to the n-type contact layer; such that a tunnel current through the barrier layer from the contact layer to the photon absorbing layer is less than a dark current in the photo-detector and the dark current from the photon-absorbing layer to the middle barrier layer which is (the dominant contribution to the total dark current of the photo-detector and which is) essentially diffusion limited, is due to the unimpeded flow of minority carriers, thus reducing generation-recombination (GR) noise of the photo-detector and reducing noise due to charge build-up in the barrier layer.

In some embodiments, the barrier layer is n-type so that the detector is configured and operable to prevent creation of a depletion layer in the photon absorbing layer when an operating bias is applied across the detector.

In some embodiments, the barrier layer is intrinsic or p-type so that the detector is configured and operable at close to zero bias whereby a diffusion current is greater than a generation-recombination current of minority carriers from the photon absorbing layer to the barrier layer and is also greater than any current in the other direction due to minority carriers thermally generated in the contact layer.

In some embodiments, the material composition and thickness of the intermediate layer are selected such that the intermediate layer prevents current flow from the contact layer to the photon absorbing layer while promoting flow of minority carriers from the photon absorbing layer to the contact layer.

In some embodiments, the intermediate layer comprises a sub-band energy level being close in energy to the conduction band of the contact layer and that lies higher in energy than the valence band of the barrier layer such that the minority carriers created in the photon absorbing layer are collected on the sub-band energy level before transfer to the contact layer.

In some embodiments, the contact layer is made of one of: $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}$ superlattice with values for the indices of $0 \leq x \leq 1$, $0 \leq x_1 \leq 1$, $0 \leq x_2 \leq 1$, $0 \leq y \leq 1$, $0 \leq y_1 \leq 1$, $0 \leq y_2 \leq 1$, $0 \leq q \leq 1$, $0 \leq q1 \leq 1$, $0 \leq q2 \leq 1$.

In some embodiments, the barrier layer is made of one of: $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}$ superlattice with values for the indices of $0 \leq x \leq 1$, $0 \leq x_1 \leq 1$, $0 \leq x_2 \leq 1$, $0 \leq y \leq 1$, $0 \leq y_1 \leq 1$, $0 \leq y_2 \leq 1$, $0 \leq q \leq 1$, $0 \leq q1 \leq 1$, $0 \leq q2 \leq 1$ which can be different from those in the contact layer.

In some embodiments, the photon absorbing layer is made of one of: $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}$ superlattice with values for the indices of $0 \leq x \leq 1$, $0 \leq x1 \leq 1$, $0 \leq x2 \leq 1$, $0 \leq y \leq 1$, $0 \leq y1 \leq 1$, $0 \leq y2 \leq 1$, $0 \leq q \leq 1$, $0 \leq q1 \leq 1$, $0 \leq q2 \leq 1$ which can be different from those in the contact layer or barrier layer.

In some embodiments, the intermediate layer is made of $In_{1-s-t}Ga_tAl_sSb_{1-v}As_v$ with $0 \leq s \leq 1$, $0 \leq t \leq 1$, $0 \leq v \leq 1$.

In a non-limiting example, the contact layer may be made of $InAs_{1-x}Sb_x$, the barrier layer is made of $AlSb_{1-y}As_y$, and the intermediate layer is made of GaSb material. The materials are selected such that the valence band of the intermediate layer lies close to or above the conduction band in the contact layer, when this layer is n-type. A sub-band energy level near the valence band of the intermediate layer collects the minority carrier holes in the barrier layer and allows the passage of the minority carrier holes into the contact layer, thereby preventing charge build up in the barrier layer. Since there is no charge build up in the barrier layer, the photo-detector is less sensitive to defects and other problems that might cause this charge concentration to vary from pixel to pixel of an FPA.

The novel structure enables the photo-detector to operate at a low configuration of operating bias, typically 0-0.5V depending on the doping in the barrier layer and its thickness. Even at zero bias the intermediate layer acts to trap holes attempting to pass from contact layer to active layer, preventing current flow in this direction, while promoting the flow of holes from photon absorbing layer to contact layer.

In some embodiments, the intermediate layer has a thickness in the range of about 50-200 A.

In some embodiments, each of the photon absorbing layer and the contact layer has a thickness in the range of about 0.1-10 μm.

In some embodiments, the photon absorbing layer has doping in the range $5 \times 10^{14}$ cm$^{-3}$ < n < $5 \times 10^{16}$ cm$^{-3}$ and the contact layer has doping in the range $5 \times 10^{14}$ cm$^{-3}$ < n < $1 \times 10^{18}$ cm$^{-3}$.

In some embodiments, the middle barrier layer has a thickness of between 0.05 and 1 μm.

In some embodiments, the middle barrier layer is n-type and is doped in the range n < $1 \times 10^{17}$ cm$^{-3}$.

In some embodiments, the middle barrier layer is p-type and is doped in the range p < $1 \times 10^{16}$ cm$^{-3}$.

The present invention also provides an array of detectors in which each detector is as described above and is connected to a silicon readout circuit by an indium bump.

The principles of the present invention described above also apply to inverted polarity structures of the form pBp in which all the doping polarities and band alignments described above are reversed.

Therefore, according to another broad aspect of the present invention there is provided a photo-detector comprising: a p-type photon absorbing layer of a first energy bandgap; a doped middle barrier layer; an intermediate layer having a second energy bandgap; and a p-type contact layer of a third energy bandgap. The layer materials are selected such that at least one of the first and third energy bandgaps of the photon absorbing and contact p-type layers are narrower than that of the middle barrier layer. The material composition and thickness of the intermediate layer are selected such that the conduction band of the intermediate layer lies close to or below the valence band in the contact layer to create efficient carrier transfer between the barrier layer and the p-type contact layer; such that a tunnel current through the barrier layer from the contact layer to the photon absorbing layer is less than a dark current in the photo-detector and the dark current from the photon-absorbing layer to the middle barrier layer which is (the dominant contribution to the total dark current of the photo-detector and which is) essentially diffusion limited, is due to the unimpeded flow of minority carriers, thus reducing generation-recombination (GR) noise of the photo-detector and reducing noise due to charge build-up in the barrier layer.

In some embodiments, the barrier layer is p-type so that the detector is configured and operable to prevent creation of a depletion layer in the photon absorbing layer when an operating bias is applied across the detector.

In some embodiments, the barrier layer is intrinsic or n-type so that the detector is configured and operable at close to zero bias.

In some embodiments, the photon absorbing layer has a doping in the range of $5 \times 10^{14}$ cm$^{-3}$ <p< $5 \times 10^{16}$ cm$^{-3}$ and the contact layer has a doping in the range of $5 \times 10^{14}$ cm$^{-3}$ <p< $5 \times 10^{18}$ cm$^{-3}$ In some embodiments, the contact layer is made of one of: $Ga_q In_y Al_{1-y-q} As_{1-x} Sb_x$ alloy or a $Ga_{q1} In_{y1} Al_{1-y1-q1} As_{1-x1} Sb_{x1}/Ga_{q2} In_{y2} Al_{1-y2-q2} As_{1-x2} Sb_{x2}$ superlattice with values for the indices of $0 \leq x \leq 1$, $0 \leq x_1 \leq 1$, $0 \leq x_2 \leq 1$, $0 \leq y \leq 1$, $0 \leq y_1 \leq 1$, $0 \leq y_2 \leq 1$, $0 \leq q \leq 1$, $0 \leq q1 \leq 1$, $0 \leq q2 \leq 1$.

In some embodiments, the barrier layer is made of one of: $Ga_q In_y Al_{1-y-q} As_{1-x} Sb_x$ alloy or a $Ga_{q1} In_{y1} Al_{1-y1-q1} As_{1-x1} Sb_{x1}/Ga_{q2} In_{y2} Al_{1-y2-q2} As_{1-x2} Sb_{x2}/Ga_{q3} In_{y3} Al_{1-y3-q3} As_{1-x3} Sb_{x3}/Ga_{q4} In_{y4} Al_{1-y4-q4} As_{1-x4} Sb_{x4}$ superlattice with values for the indices of $0 \leq x \leq 1$, $0 \leq x_1 \leq 1$, $0 \leq x_2 \leq 1$, $0 \leq x_3 \leq 1$, $0 \leq x_4 \leq 1$, $0 \leq y \leq 1$, $0 \leq y_1 \leq 1$, $0 \leq y_2 \leq 1$, $0 \leq y_3 \leq 1$, $0 \leq y_4 \leq 1$, $0 \leq q \leq 1$, $0 \leq q_1 \leq 1$, $0 \leq q_2 \leq 1$, $0 \leq q_3 \leq 1$, $0 \leq q_4 \leq 1$, where the same symbol can have a different value from its value in the contact layer.

In some embodiments, the photon absorbing layer is made of one of: $Ga_q In_y Al_{1-y-q} As_{1-x} Sb_x$ alloy or a $Ga_{q1} In_{y1} Al_{1-y1-q1} As_{1-x1} Sb_{x1}/Ga_{q2} In_{y2} Al_{1-y2-q2} As_{1-x2} Sb_{x2}$ superlattice with values for the indices of $0 \leq x \leq 1$, $0 \leq x1 \leq 1$, $0 \leq x2 \leq 1$, $0 \leq y \leq 1$, $0 \leq y1 \leq 1$, $0 \leq y2 \leq 1$, $0 \leq q \leq 1$, $0 \leq q1 \leq 1$, $0 \leq q2 \leq 1$ which can be different from those in the contact layer or barrier layer.

In some embodiments, the intermediate layer is made of $In_{1-s-t} Ga_t Al_s Sb_{1-v} As_v$ with $0 \leq s \leq 1$, $0 \leq t \leq 1$, $0 \leq v \leq 1$.

The present invention can also be made by inserting an intermediate layer between the barrier layer and the contact layer in a pBn structure. In this case the p-doping in the contact layer should be large enough (e.g. $>10^{18}$ cm$^{-3}$) to ensure efficient tunneling of holes out of the sub-band energy level in the intermediate layer into the valence band of the contact layer. Therefore, according to another broad aspect of the present invention there is provided a photo-detector comprising: a n-type photon absorbing layer of a first energy bandgap; a doped middle barrier layer, an intermediate layer of a second energy bandgap and a p-type contact layer of a third energy bandgap. The layer materials are selected such that the first energy bandgap of the photon absorbing n-type layer is narrower than that of the middle barrier layer. The material composition and thickness of the intermediate layer are selected such that the valence band of the intermediate layer lies higher in energy than that of the barrier layer in order to create an efficient collection of minority carriers and transfer by tunneling to the p-type contact layer; such that a tunnel current through the barrier layer from the contact layer to the photon absorbing layer is less than a dark current in the photo-detector and the dark current from the photon-absorbing layer to the middle barrier layer which is (the dominant contribution to the total dark current of the photo-detector and which is) essentially diffusion limited, is due to the unimpeded flow of minority carriers, thus reducing generation-recombination (GR) noise of the photo-detector and reducing noise due to charge build-up in the barrier layer.

In some embodiments, the barrier layer is n-type so that the detector is configured and operable to prevent creation of a depletion layer in the photon absorbing layer when an operating bias is applied across the detector.

In some embodiments, the barrier layer is intrinsic or p-type so that the detector is configured and operable at close to zero bias.

In some embodiments, the photon absorbing layer has doping in the range $5 \times 10^{14}$ cm$^{-3}$ <n< $5 \times 10^{16}$ cm$^{-3}$ and the contact layer has doping in the range of $5 \times 10^{17}$ <p< $5 \times 10^{18}$ cm$^{-3}$.

In some embodiments, the contact layer is made of one of: $Ga_q In_y Al_{1-y-q} As_{1-x} Sb_x$ alloy or a $Ga_{q1} In_{y1} Al_{1-y1-q1} As_{1-x1} Sb_{x1}/Ga_{q2} In_{y2} Al_{1-y2-q2} As_{1-x2} Sb_{x2}$ superlattice with values for the indices of $0 \leq x \leq 1$, $0 \leq x_1 \leq 1$, $0 \leq x_2 \leq 1$, $0 \leq y \leq 1$, $0 \leq y_1 \leq 1$, $0 \leq y_2 \leq 1$, $0 \leq q \leq 1$, $0 \leq q1 \leq 1$, $0 \leq q2 \leq 1$.

In some embodiments, the barrier layer is made of one of: $Ga_q In_y Al_{1-y-q} As_{1-x} Sb_x$ alloy or a $Ga_{q1} In_{y1} Al_{1-y1-q1} As_{1-x1} Sb_{x1}/Ga_{q2} In_{y2} Al_{1-y2-q2} As_{1-x2} Sb_{x2}$ superlattice with values for the indices of $0 \leq x \leq 1$, $0 \leq x_1 \leq 1$, $0 \leq x_2 \leq 1$, $0 \leq y \leq 1$, $0 \leq y_1 \leq 1$, $0 \leq y_2 \leq 1$, $0 \leq q \leq 1$, $0 \leq q1 \leq 1$, $0 \leq q2 \leq 1$ which can be different from those in the contact layer.

In some embodiments, the photon absorbing layer is made of one of: $Ga_q In_y Al_{1-y-q} As_{1-x} Sb_x$ alloy or a $Ga_{q1} In_{y1} Al_{1-y1-q1} As_{1-x1} Sb_{x1}/Ga_{q2} In_{y2} Al_{1-y2-q2} As_{1-x2} Sb_{x2}$ superlattice with values for the indices of $0 \leq x \leq 1$, $0 \leq x_1 \leq 1$, $0 \leq x2 \leq 1$, $0 \leq y \leq 1$, $0 \leq y1 \leq 1$, $0 \leq y2 \leq 1$, $0 \leq q \leq 1$, $0 \leq q1 \leq 1$, $0 \leq q2 \leq 1$ which can be different from those in the contact layer or barrier layer.

In some embodiments, the intermediate layer is made of $In_{1-s-t} Ga_t Al_s Sb_{1-v} As_v$ with $0 \leq s \leq 1$, $0 \leq t \leq 1$, $0 \leq v \leq 1$.

The principles of the present invention described above also apply to inverted polarity structures of the form nBp in which all the doping polarities and band alignments described above are reversed.

Therefore, according to another broad aspect of the present invention there is provided a photo-detector comprising: a p-type photon absorbing layer of a first energy bandgap; a doped middle barrier layer, an intermediate layer of a second energy bandgap and an n-type contact layer of a third energy bandgap. The layer materials are selected such that the first energy bandgap of the n-type photon absorbing layer is narrower than that of the middle barrier layer. The material composition and thickness of the intermediate layer are selected such that the conduction band of the intermediate layer lies lower in energy than that of the barrier layer in order to create an efficient collection of minority carriers and transfer of minority carriers from the intermediate layer to the contact layer by tunneling to the n-type contact layer; such that a tunnel current through the barrier layer from the contact layer to the photon absorbing layer is less than a dark current in the photo-detector and the dark current from the photon-absorbing layer to the middle barrier layer which is (the dominant contribution to the total dark current of the photo-detector and which is) essentially diffusion limited, is due to the unimpeded flow of minority carriers, thus reducing generation-recombination (GR) noise of the photo-detector and reducing noise due to charge build-up in the barrier layer. The intermediate layer comprises a sub-band energy level that lies lower in energy than the conduction band of the barrier layer such that minority carriers created in the photon absorbing layer are collected on the sub-band energy level before transfer to the contact layer.

In some embodiments, the barrier layer is p-type so that the detector is configured and operable to prevent creation of a depletion layer in the photon absorbing layer when an operating bias is applied across the detector.

In some embodiments, the barrier layer is intrinsic or n-type so that the detector is configured and operable at close to zero bias.

In some embodiments, the photon absorbing layer has doping in the range of $5 \times 10^{14}$ cm$^{-3}$ <p< $5 \times 10^{16}$ cm$^{-3}$ and the contact layer has doping in the range $1 \times 10^{17}$ cm$^{-3}$ <n< $1 \times 10^{18}$ cm$^{-3}$ In some embodiments, the contact layer is made of one of: $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}/Ga_{q3}In_{y3}Al_{1-y3-q3}As_{1-x3}Sb_{x3}/Ga_{q4}In_{y4}Al_{1-y4-q4}As_{1-x4}Sb_{x4}$ superlattice with values for the indices of $0 \leq x \leq 1$, $0 \leq x_1 \leq 1$, $0 \leq x_2 \leq 1$, $0 \leq x_3 \leq 1$, $0 \leq x_4 \leq 1$, $0 \leq y \leq 1$, $0 \leq y_1 \leq 1$, $0 \leq y_2 \leq 1$, $0 \leq y_3 \leq 1$, $0 \leq y_4 \leq 1$, $0 \leq q \leq 1$, $0 \leq q_1 \leq 1$, $0 \leq q_2 \leq 1$, $0 \leq q_3 \leq 1$, $0 \leq q_4 \leq 1$.

In some embodiments, the barrier layer is made of one of: $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}/Ga_{q3}In_{y3}Al_{1-y3-q3}As_{1-x3}Sb_{x3}/Ga_{q4}In_{y4}Al_{1-y4-q4}As_{1-x4}Sb_{x4}$ superlattice with values for the indices of $0 \leq x \leq 1$, $0 \leq x_1 \leq 1$, $0 \leq x_2 \leq 1$, $0 \leq x_3 \leq 1$, $0 \leq x_4 \leq 1$, $0 \leq y \leq 1$, $0 \leq y_1 \leq 1$, $0 \leq y_2 \leq 1$, $0 \leq y_3 \leq 1$, $0 \leq y_4 \leq 1$, $0 \leq q \leq 1$, $0 \leq q_1 \leq 1$, $0 \leq q_2 \leq 1$, $0 \leq q_3 \leq 1$, $0 \leq q_4 \leq 1$, where the same symbol can have a different value from its value in the contact layer.

In some embodiments, the photon absorbing layer is made of one of: $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}$ superlattice with values for the indices of $0 \leq x \leq 1$, $0 \leq x1 \leq 1$, $0 \leq x2 \leq 1$, $0 \leq y \leq 1$, $0 \leq y1 \leq 1$, $0 \leq y2 \leq 1$, $0 \leq q \leq 1$, $0 \leq q1 \leq 1$, $0 \leq q2 \leq 1$ where the same symbol can have a different value from its value in the contact or barrier layer.

In some embodiments, the intermediate layer is made of $In_{1-s-t}Ga_tAl_sSb_{1-v}As_v$ with $0 \leq s \leq 1$, $0 \leq t \leq 1$, $0 \leq v \leq 1$.

In some nBn and pBn embodiments, the present invention also provides a photo-detector comprising a graded GaAlSbAs barrier layer from a low Ga content (typically 0-10%) near the photon absorbing layer to a very high Ga content (typically 90-100%) near the contact layer, such that the valence band at the edge of the barrier layer next to the contact layer lies near or above the conduction band of the contact layer.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 2:
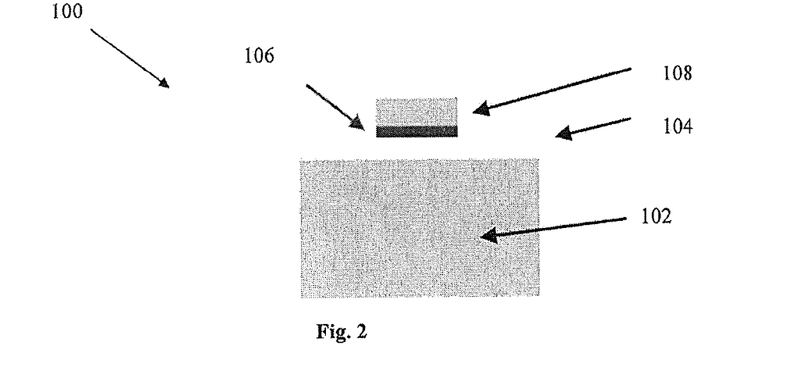
FIG. 2 illustrates in a schematic cross-section form, a possible structural arrangement of an embodiment of the photo-detector of the present invention.

Reference is made to FIG. 2 illustrating in a schematic cross-section form, a possible structural arrangement of an embodiment of the photo-detector. The photo-detector 100 comprises a first n-type photon absorbing layer 102 of a first energy bandgap, a doped middle barrier layer 104, an intermediate layer 106 being a semiconductor structure with a second energy bandgap and an n-type contact layer 108 of a third energy bandgap. The layer materials are selected such that the energy bandgaps of the photon absorbing layer and contact n-type layers are narrower than that of the middle barrier layer. In the detector of the present invention the tunnel current from the contact layer to the photon absorbing layer is less than a dark current in the photo-detector and the dark current from the photo-absorbing layer to the middle barrier layer which is (the dominant contribution to the total dark current of the photo-detector and which is) essentially diffusion limited, is due to the unimpeded flow of minority carriers, thus reducing generation-recombination (GR) noise of the photo-detector and reducing noise due to charge build-up in the barrier layer.

In some embodiments, then-type photon-absorbing layer 102 is made of one of: $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}$ superlattice with values for the indices of $0 \leq x \leq 1$, $0 \leq x1 \leq 1$, $0 \leq x2 \leq 1$, $0 \leq y \leq 1$, $0 \leq y1 \leq 1$, $0 \leq y2 \leq 1$, $0 \leq q \leq 1$, $0 \leq q1 \leq 1$, $0 \leq q2 \leq 1$. In a specific and non-limiting example, the n-type photon-absorbing layer 102 is made of $InAs_{1-x}Sb_x$ alloy, or an $InAs_{1-x1}Sb_{x1}/InAs_{1-x2}Sb_{x2}$ superlattice. The doping is typically in the range of $n < 2 \times 10^{16}$ cm$^{-3}$ and the thickness is typically in the range 1-10 μm. The use of $InAs_{1-x}Sb_x$ based alloys or superlattices enables operation in the MWIR atmospheric transmission window (3-5 μm). The photon absorbing layer may be buried at a finite depth below the contact layer i.e. typically to a depth of 0.1-10 μm. The contact layer 108 is made of $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}$ superlattice with values for the indices of $0 \leq x \leq 1$, $0 \leq x_1 \leq 1$, $0 \leq x_2 \leq 1$, $0 \leq y \leq 1$, $0 \leq y_1 \leq 1$, $0 \leq y_2 \leq 1$, $0 \leq q \leq 1$, $0 \leq q1 \leq 1$, $0 \leq q2 \leq 1$. In a specific and non-limiting example, the contact layer 108 is made of n-type $InAs_{1-x}Sb_x$ or an $InAs_{1-x1}Sb_{x1}/InAs_{1-x2}Sb_{x2}$ superlattice with typical values of doping in the range $5 \times 10^{14}$ cm$^{-3} < n < 1 \times 10^{18}$ cm$^{-3}$ and thickness$>0.1$ μm. The barrier layer 104 is made of $Ga_qIn_yAl_{1-y-q}As_{1-x}Sb_x$ alloy or a $Ga_{q1}In_{y1}Al_{1-y1-q1}As_{1-x1}Sb_{x1}/Ga_{q2}In_{y2}Al_{1-y2-q2}As_{1-x2}Sb_{x2}$ superlattice with values for the indices of $0 \leq x \leq 1$, $0 \leq x_1 \leq 1$, $0 \leq x_2 \leq 1$, $0 \leq y \leq 1$, $0 \leq y_1 \leq 1$, $0 \leq y_2 \leq 1$, $0 \leq q \leq 1$, $0 \leq q1 \leq 1$, $0 \leq q2 \leq 1$. In a specific and non-limiting example, the barrier layer 104 is made of $AlSb_{1-y}As_y$ alloy, with thickness typically in the range of 0.05-1 μm. The barrier layer 104 is n-type with a typical doping range of $1 \times 10^{15}$ cm$^{-3} \leq n < 1 \times 10^{17}$ cm$^{-3}$. The n-type doping of the barrier layer prevents the creation of a depletion region in the photon absorbing layer when an operating bias is applied across the detector. The intermediate layer 106 is made of a pseudomorphic semiconductor structure meaning that the layer grows with all of the in-plane lattice spacings in register and equal to each other. The intermediate layer 106 is made of $In_{1-s-t}Ga_tAl_sSb_{1-v}As_v$ with $0 \leq s \leq 1$, $0 \leq t \leq 1$, $0 \leq v \leq 1$. In some embodiments, the intermediate layer is made from a thin single semiconducting material with no use of metals or insulators. In a specific and non-limiting example, the intermediate layer 106 is made of GaSb and has a thickness in the range of about 50-200 A. The intermediate layer 106 should preferably be undoped.

It should be understood that the selection of $InAs_{1-x}Sb_x$ alloy or an $InAs_{1-x1}Sb_{x1}/InAs_{1-x2}Sb_{x2}$ superlattice for the n-type photon-absorbing layer is expected to confer a longer minority carrier lifetime in this layer in comparison with a layer made from a Type II superlattice (InAs/GaSb) as described for example in E. H. Steenbergen et al, Appl. Phys. Lett. 99, 251110, (2011). The hole mobility is also expected to be higher in the alloy and in certain configurations of the $InAs_{1-x1}Sb_{x1}/InAs_{1-x2}Sb_{x2}$ superlattice. However, when $InAs_{1-x}Sb_x$ alloy lattice matched to a GaSb substrate is selected to be the material used for the n-type photon-absorbing layer, a (lattice matched) barrier material giving an appropriate band alignment with the valence band (as required in an ideal $nB_nn$ structure) does not exist. The closest is $AlSb_{0.91}As_{0.09}$, but it has an offset of about 150 meV (i.e. it is about 150 meV too high), and this can lead to a blockage between the barrier layer and the contact layer for minority carriers i.e. holes. The present invention enables the removal of the blockage between the barrier layer and the contact layer for minority carriers as well as the operation of the photo-detector at a low bias.

The semiconductor layers are usually grown by modern semiconductor epitaxy methods such as Liquid Phase Epitaxy (LPE), Molecular Beam Epitaxy (MBE), Metal-Organic Vapour Phase Epitaxy (MOVPE), or any of their derivatives, onto a semiconductor substrate [e.g. see "Klin et al, "Progress with Antimonide Based Detectors at SCD", Proc. Infrared Technology and Applications XXXV, SPIE 7298, 7298-OG (2009)].

After growth, the wafer is etched into a mesa structure, after which the sides are passivated with a suitable chemical treatment and/or with the application of a suitable insulating or dielectric layer and electrical contacts are then applied (though vias opened up in the insulating or dielectric layer). The depth of the mesa can vary but it should be etched at least up to the beginning of the barrier layer (which is fully depleted and therefore insulating) to provide suitable isolation between the mesa and other devices. The passivation performs one or more of the following roles: (i) protection of any exposed surfaces from attack by oxygen (especially those of Aluminium containing compounds such an $AlSb_{1-y}As_y$ barrier layer) (ii) controlling the surface potential of any exposed surfaces (to avoid surface accumulation or inversion, which would lead, for example, to shorting between neighbouring devices). After the wafer is etched into a mesa structure, only the edges of the intermediate semiconducting layer are exposed (e.g. a region of height 50-200 A). These edges are depicted at the ends of the layer 106 in FIG. 2. The intermediate layer 106 is not connected to any external potential source and does not absorb minority carriers but transfers them. No contact wire is attached to the intermediate layer 106. The energy bands of the intermediate layer 106 must have the correct discontinuous energy band alignment with those of the surrounding materials in order to achieve efficient carrier transfer from the barrier layer 104 to the contact layer 108 thereby conferring a number of benefits including operation at lower bias and lower noise due to no charge build up in the barrier as described above.

The substrate is usually thinned or removed to allow tight to pass without significant losses due to free carrier absorption, and also to avoid possible cracking or other stress related problems at low temperatures.

Figure 3A:
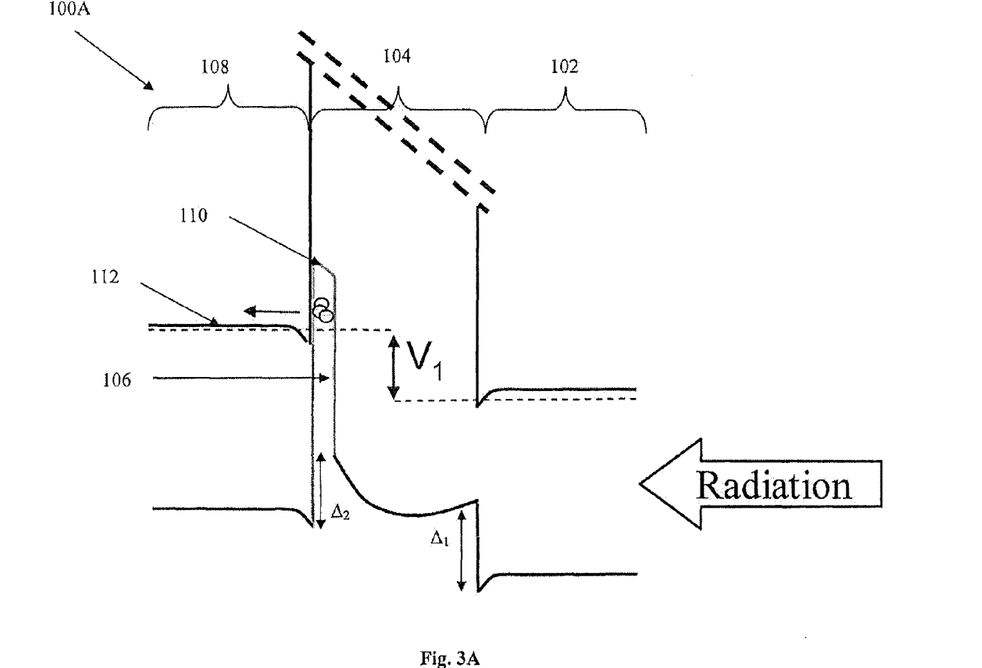
FIG. 3A shows a band diagram of the photo-detector of the present invention according to the embodiment described in FIG. 2 with an n-type barrier.

FIG. 3A shows a band diagram of the photo-detector of the present invention with an n-type barrier layer according to the embodiment described in FIG. 2.

As described with respect to FIG. 2, the photo-detector 100A comprises two n-type narrow bandgap layers 102 and 108 surrounding a middle barrier layer 104 that has an energy bandgap significantly larger than that of the two surrounding layers and which allows the unimpeded diffusion of minority carriers from the photon absorbing layer 102 to the barrier layer 104. An intermediate layer 106 is located between the barrier layer 104 and the contact layer 108. The n-type photon absorbing layer 102 has a narrow energy bandgap selected for its cut-off wavelength and absorbs the radiation impinged on the photo-detector. The middle barrier layer 104 prevents tunneling of electrons from the conduction band (and at sufficiently high bias also from the valence band) of the n-type contact layer 108 to the conduction band of the photon-absorbing layer 102. The contact layer 108 has a narrow bandgap and acts as a contact for biasing the device. The contact layer 108 is biased negative with respect to the photon absorbing layer 102.

In FIG. 3A, $\Delta_1$ indicates the valence band offset between the barrier layer 104 and the active photon-absorbing layer 102 (positive when the valence band of the barrier layer is highest in energy). $\Delta_2$ is the valence band offset between the contact-layer 108 and the barrier layer 104 (positive when the valence band of the contact layer is lowest in energy). A hole sub-band energy level exists in the intermediate layer 106 which is close in energy to the conduction band of the contact layer. Minority carrier holes in the barrier layer 104 illustrated in the figure by circles, collect on this sub-band energy level and then pass easily into the contact layer 108, thereby preventing charge build up in the barrier layer. Thee material composition and thickness of the intermediate layer are selected such that the valence band 110 of the intermediate layer 106 lies close to or above the conduction band 112 in the contact layer 108.

When the photo-detector 100A of the invention is biased to its maximum operating bias, slightly above $V_1$, with an externally applied voltage, the bands in the photon absorbing layer 102 are flat right up to the barrier layer 104 and minority carriers (holes) can pass freely by diffusion from the photon absorbing layer 102 into the barrier layer 104. The photo-detector will also work at slightly lower bias values, $V_1$, when the edge of the photon absorbing layer 102 next to the barrier layer 104 can become accumulated. During operation, the flat part of the valence band edge of the photon absorbing layer 102 never lies above the flat part of the valence band edge of the contact layer 108. The edge of the contact layer 108 next to the barrier layer is accumulated both at maximum bias and at lower biases. During operation, a depletion region is allowed only in the barrier layer 104 but not in the active photon-absorbing layer 102. The doping of the barrier layer 104 (and to a lesser degree that in the n-type contact layer 108) is selected according to the present invention to adjust the operating bias to a desirable value.

As will be explained in detail further below with respect to FIGS. 4A and 4B, although the barrier is usually doped n-type, another implementation of the device can be made which operates at a small or even zero bias in which low (typically $p<5\times10^{15}$ cm$^{-3}$) p-type doping is used in the barrier layer, due to the asymmetric nature of the layer structure, whereby the intermediate layer acts to enhance the transfer of photoexcited carriers originating in the photon absorbing layer into the contact layer, while preventing back flow.

Some techniques have been developed to provide specific designs of barrier photo-detectors with high performance. Barrier infrared detector with absorber materials having selectable cutoff wavelengths have been developed as described for example in US Patent Publication 2010/072514. A GaInAsSb absorber layer is grown on a GaSb substrate layer formed by mixing GaSb and InAs$_{1-x}$Sb$_x$ by an absorber mixing ratio. A GaAlAsSb barrier layer is then grown on the barrier layer formed by mixing GaSb and AlSb$_{1-y}$As$_y$ by a barrier mixing ratio. The technique described in US Patent Publication 2010/072514 proposes to eliminate the offset $\Delta_2$ by using a quaternary GaInAsSb contact layer. However, the growth of a quaternary GaInAsSb material for the contact layer is much harder to control than the growth of a ternary InAs$_{1-x}$Sb$_x$ material, and any segregation of the quaternary into InAs$_{1-x}$Sb$_x$ and GaSb could cause a local type II band alignment with a much smaller bandgap, and thereby lead to a substantial variation in the bandgap.

Figure 3B:
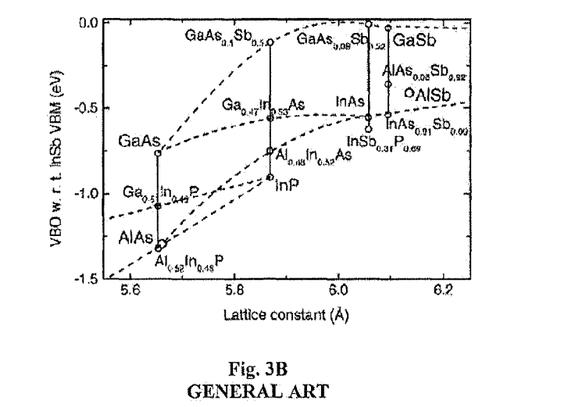
FIG. 3B is a general knowledge illustration showing the valence band offset as a function of lattice constant for a number of binary and ternary semiconductor materials including InAs, GaSb, $AlSb_{0.92}As_{0.08}$, and $InAs_{0.91}As_{0.09}$.

Moreover, the use of a GaAlAsSb barrier does not eliminate the offsets, $\Delta_1$ and $\Delta_2$, when both the photon absorbing and contact layers are made from the ternary material, InAs$_{1-x}$Sb$_x$ or an InAs$_{1-x1}$Sb$_{x1}$/InAs$_{1-x2}$Sb$_{x2}$ superlattice, for a wide range of useful compositions, x or x$_1$ and x$_2$. This may be seen for example in FIG. 3B being the FIG. 11 on page 5855 of the Review article by Vurgaftman et al, Journ. of Appl. Phys., Vol. 89, pp 5815-5875. This figure shows that the valence bands of AlSb$_{0.92}$As$_{0.09}$ and GaSb lie approximately 150 and 500 meV above the valence bands of InAs$_{0.91}$As$_{0.09}$ or InAs and that the first three materials have the same lattice parameter as GaSb. Thus an alloy of GaSb and AlSb$_{0.92}$As$_{0.08}$ that is lattice matched to a GaSb substrate is expected to exhibit a valence band energy that is between 150 and 500 meV above that of lattice matched InAs$_{0.91}$As$_{0.09}$.

A mixture of the two structures shown in FIGS. 1A and 1B could be used with an appropriate mixing ratio to achieve valence band alignment between the AlSb$_{0.92}$As$_{0.08}$ barrier layer and a GaInAsSb contact layer, thereby eliminating $\Delta_2$. The contact layer would then be a GaInAsSb quaternary material which would be hard to grow, and the uniformity of whose bandgap would be hard to control (as already discussed above) over the approximately 1 cm×1 cm area of a Focal Plane Array detector.

The combination of barrier layer and absorber must be carefully selected to yield optimal results. Building an optimal nBn or CBn (general name: XBn) infrared detector requires a compatible set of absorber, contact and barrier materials with the following conditions: (1) their valence band edges must be aligned to allow unimpeded hole flow, while their conduction band edges should have a large difference to form an electron barrier, (2) they must have substantially similar lattice constants, and (3) their lattice constants should also match closely to that of a readily available semiconductor substrate material (or a relatively dislocation free buffer layer grown on a readily available substrate) that they are grown on in order to ensure high material quality and low defect density. When criterion (1) is not perfectly fulfilled, so that there is some impediment to the flow of holes due to the valence band of the barrier layer having a higher energy than that for perfect alignment, this impediment can be overcome with the present invention, which therefore provides a simple technique to enable efficient transfer of the minority carriers to the contact layer without blockage, while also effectively preventing the majority carriers in the contact layer from tunneling into the active layer.

Figure 3C:
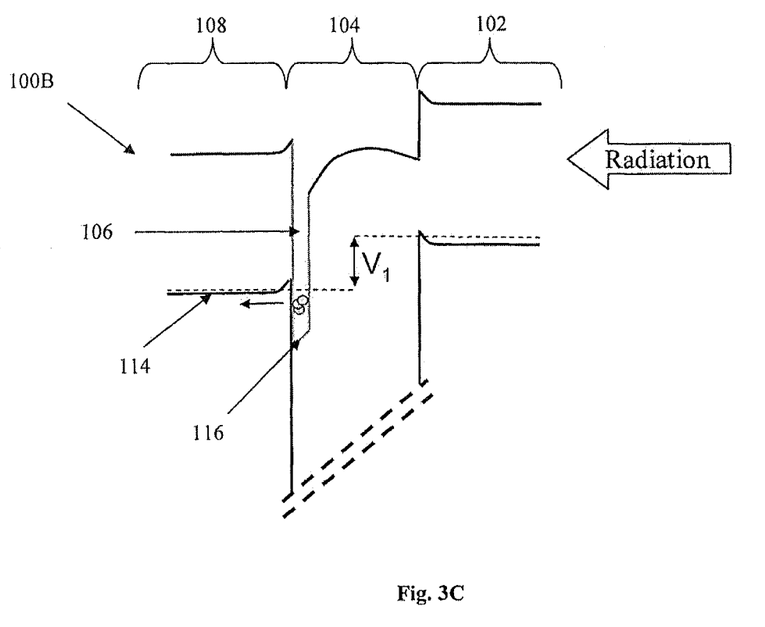
FIG. 3C shows a band diagram of the photo-detector of the present invention according to the embodiment in FIG. 3A in which the polarity is reversed.

FIG. 3C exemplifies a band diagram of the photo-detector of the present invention, in which the doping polarities of the photon absorbing, barrier and contact layers have been reversed compared with the embodiment in FIG. 3A. The photo-detector 100B comprises a photon absorbing p-type layer 102 of a first energy bandgap; a doped middle barrier layer 104; an intermediate layer 106 with a second energy bandgap; and a contact p-type layer of a third energy bandgap 108. The layer materials are selected such that the first and third energy bandgaps of the photon absorbing 102 and contact 108 p-type layers are narrower than that of the middle barrier layer 104. The material composition and thickness of the intermediate layer 106 are selected such that the conduction band 114 of the intermediate layer lies below the valence band 116 in the contact layer 108 to allow efficient transfer of minority carrier (electrons) between the barrier layer and the contact p-type layer.

In some embodiments, the p-type photon-absorbing layer 102 is made of one of: Ga$_q$In$_y$Al$_{1-y-q}$As$_{1-x}$Sb$_x$ alloy or a Ga$_{q1}$In$_{y1}$Al$_{1-y1-q1}$As$_{1-x1}$Sb$_{x1}$/Ga$_{q2}$In$_{y2}$Al$_{1-y2-q2}$As$_{1-x2}$Sb$_{x2}$ superlattice with values for the indices of $0\leq x\leq 1$, $0\leq x1\leq 1$, $0\leq x2\leq 1$, $0\leq y\leq 1$, $0\leq y1\leq 1$, $0\leq y2\leq 1$, $0\leq q\leq 1$, $0\leq q1\leq 1$, $0\leq q2\leq 1$. In a specific and non-limiting example, the p-type photon-absorbing layer 102 is made of an InAs/GaSb superlattice. The doping is typically in the range of $5\times10^{14}$ cm$^{-3}<p<5\times 10^{16}$ cm$^{-3}$ and the thickness is typically in the range 1-10 μm. The use of InAs/GaSb superlattices enables operation in the MWIR (3-5 μm) or the LWIR (8-12 μm) atmospheric transmission windows. The photon absorbing layer may be buried at a finite depth below the contact layer i.e. typically to a depth of 0.1-10 μm. The contact layer 108 is made of Ga$_q$In$_y$Al$_{1-y-q}$As$_{1-x}$Sb$_x$ alloy or a Ga$_{q1}$In$_{y1}$Al$_{1-y1-q1}$As$_{1-x1}$Sb$_{x1}$/Ga$_{q2}$In$_{y2}$Al$_{1-y2-q2}$As$_{1-x2}$Sb$_{x2}$ superlattice with values for the indices of $0\leq x\leq 1$, $0\leq x_1\leq 1$, $0\leq x_2\leq 1$, $0\leq y\leq 1$, $0\leq y_1\leq 1$, $0\leq y_2\leq 1$, $0\leq q\leq 1$, $0\leq q1\leq 1$, $0\leq q2\leq 1$. In a specific and non-limiting example, the contact layer 108 is made of an InAs/GaSb superlattice with typical values of doping in the range $5\times10^{14}$ cm$^{-3}<p<5\times10^{18}$ cm$^{-3}$ and thickness>0.1 μm. The barrier layer 104 is made of Ga$_q$In$_y$Al$_{1-y-q}$As$_{1-x}$Sb$_x$ alloy or a Ga$_{q1}$In$_{y1}$Al$_{1-y1-q1}$As$_{1-x1}$Sb$_{x1}$/Ga$_{q2}$In$_{y2}$Al$_{1-y2-q2}$As$_{1-x2}$Sb$_{x2}$/Ga$_{q3}$In$_{y3}$Al$_{1-y3-q3}$As$_{1-x3}$Sb$_{x3}$/Ga$_{q4}$In$_{y4}$Al$_{1-y4-q4}$Sb$_{x4}$ superlattice with values for the indices of $0\leq x\leq 1$, $0\leq x_1\leq 1$, $0\leq x_2\leq 1$, $0\leq x_3\leq 1$, $0\leq x_4\leq 1$, $0\leq y\leq 1$, $0\leq y_1\leq 1$, $0\leq y_2\leq 1$, $0\leq y_3\leq 1$, $0\leq y_4\leq 1$, $0\leq q\leq 1$, $0\leq q_1\leq 1$, $0\leq q_2\leq 1$, $0\leq q_3\leq 1$, $0\leq q_4\leq 1$. Therefore, in a specific and non-limiting example, the structure may be a two layer structure, a three layer structure, or a four layer structure. In a specific and non-limiting example, the barrier layer 104 is made of an InAs/AlSb superlattice, with thickness typically in the range of 0.05-1 μm. The barrier layer 104 is p-type with a typical doping range of $1\times10^{15}$ cm$^{-3}\leq p<1\times10^{17}$ cm$^{-3}$. The p-type doping of the barrier layer prevents the creation of a depletion region in the photon absorbing layer when an operating bias is applied across the detector. The intermediate layer 106 is made of a pseudomorphic semiconductor structure meaning that the layer grows with all of the in-plane lattice spacings in register and equal to each other. The intermediate layer 106 is made of In$_{1-s-t}$Ga$_t$Al$_s$Sb$_{1-v}$As$_v$ with $0\leq s\leq 1$, $0\leq t\leq 1$, $0\leq v\leq 1$. In some embodiments, the intermediate layer is made from a thin single semiconducting material with no use of metals or insulators. In a specific and non-limiting example, the intermediate layer 106 is made of InAs or InAsSb alloy and has a thickness in the range of about 100-200 A. The intermediate layer 106 should preferably be undoped.

As will be explained in detail further below with respect to FIG. 4C, although the barrier is usually doped p-type, another implementation of the device can be made which operates at a small or even zero bias in which low (typically $n<5\times10^{15}\text{cm}^{-3}$) n-type doping is used in the barrier layer, due to the asymmetric nature of the layer structure, whereby the intermediate layer acts to enhance the transfer of photoexcited carriers originating in the photon absorbing layer into the contact layer, while preventing back flow.

Figure 4A:
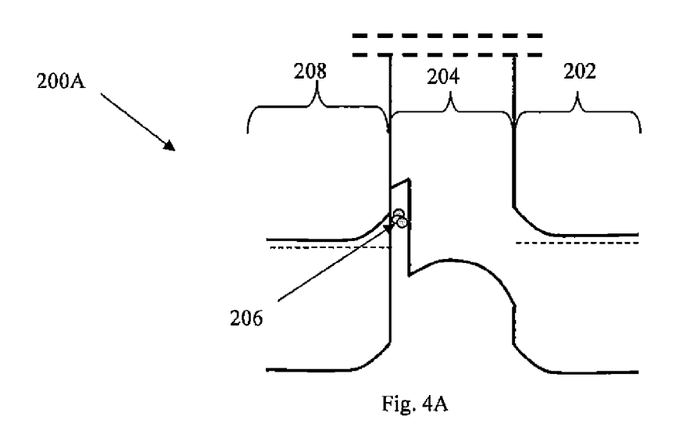
FIG. 4A shows a band diagram of the photo-detector of the present invention according to the embodiment described in FIG. 2 having a p-type barrier layer when the photo-detector is operated at zero bias.
Figure 4B:
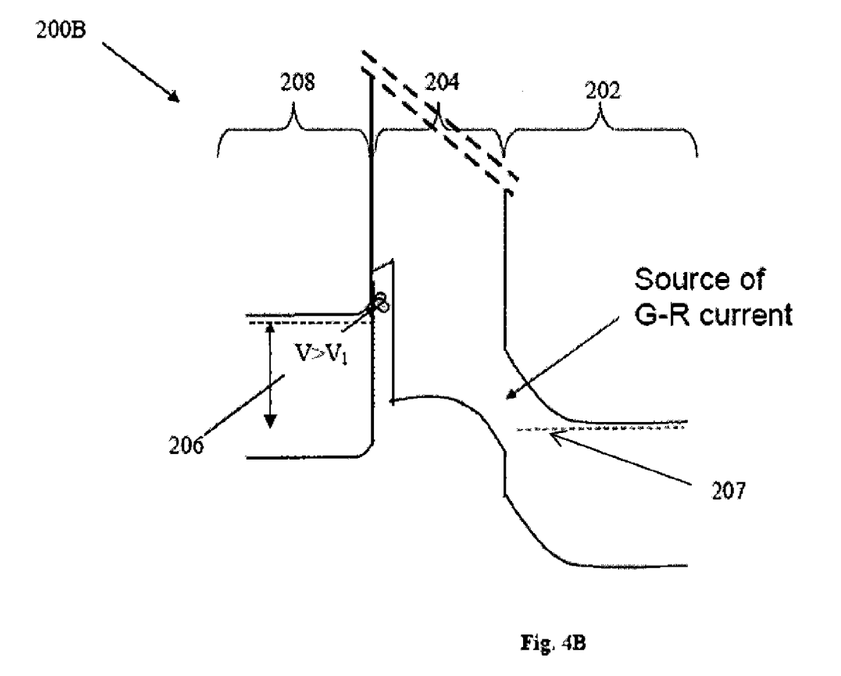
FIG. 4B shows a band diagram of the photo-detector of the present invention according to the embodiment described in FIG. 2 having a p-type barrier layer when the photo-detector is biased.
Figure 4C:
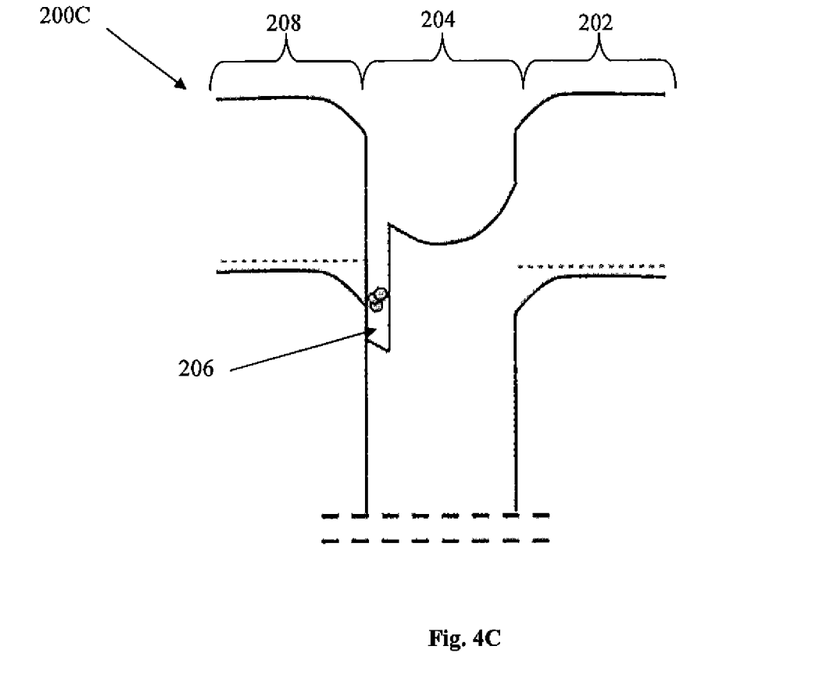
FIG. 4C shows a band diagram of the photo-detector of the present invention according to the embodiment of FIG. 4A in which the polarity is reversed.

Reference is made to FIGS. 4A-4C showing band diagrams of the photo-detector according to some embodiments of the present invention. The photo-detectors 200A-20013-200C comprise a first photon absorbing layer 202 of a first energy bandgap, a doped middle barrier layer 204, an intermediate layer 206 and a contact layer 208. More specifically, the photo-detectors 200A and 200B illustrated in FIG. 4A and in FIG. 4B have a p-type barrier layer 204 and are operated at zero bias and are biased respectively. FIG. 4C shows a band diagram of the photo-detector according to the embodiment of FIG. 4A in which the polarity is reversed and the photo-detector 200C is operated at zero bias. As clearly shown in FIG. 4B, when the photo-detector 200B is biased beyond its small operating bias $V_1$ such that the quasi-Fermi level 207 in the photon absorbing layer 202 near the barrier layer 204 lies sufficiently far below the conduction band of the photon absorbing layer 202, an unwanted G-R dark current is generated. Therefore the bias must be below $V_1$ so that the quasi-Fermi level in the photon absorbing layer 202 near the barrier layer 204 lies sufficiently close to the conduction band of the photon absorbing layer 202 to ensure that the dark current from the photon-absorbing layer 202 to the middle barrier layer 204 is essentially diffusion limited.

The device can also be made by introducing an intermediate GaSb layer into a pBn device, between the p-type contact layer and the barrier layer. In this case the p-doping in the contact layer should be quite high to ensure that minority holes illustrated by circles which are collected on the sub-band energy level of the intermediate layer 306 can tunnel efficiently to the valence band of the contact layer 308. An example is to shown in FIG. 5A.

Figure 5A:
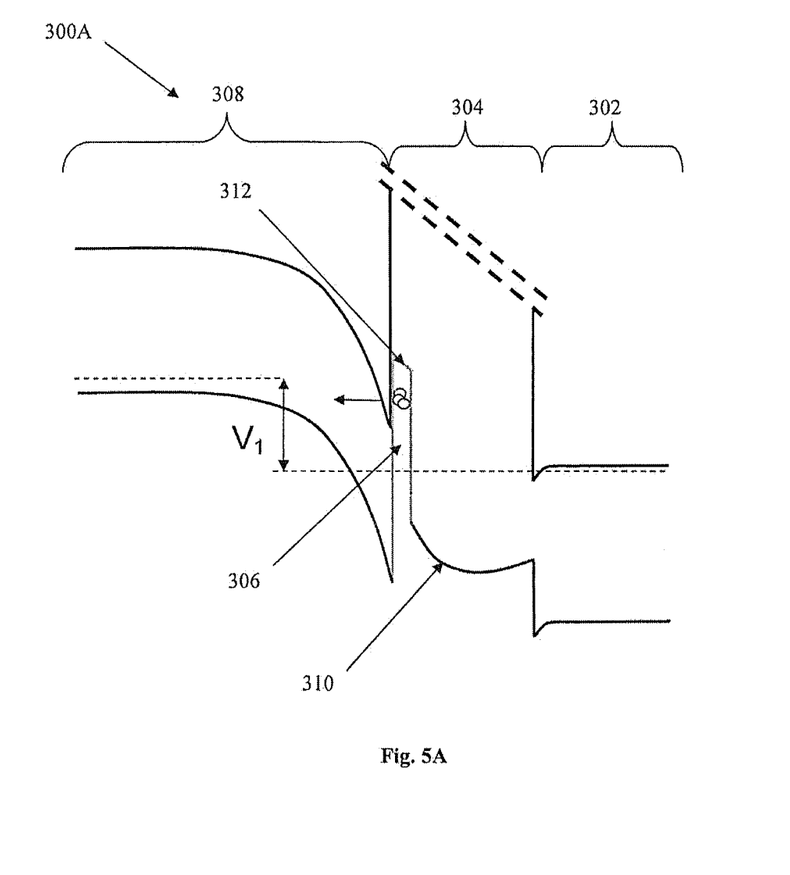
FIG. 5A shows a band diagram of the photo-detector of the present invention according to another embodiment of the present invention.

The photo-detector 300A comprises a p-type contact layer 308 and an n-type photon-absorbing layer 302 surrounding a middle barrier layer 304. The n-type photon absorbing layer 302 has a narrow energy bandgap selected for its cut-off wavelength and absorbs the radiation impinged on the photo-detector. The energy bandgap of the n-type photon absorbing layer 302 is narrower than that of the middle barrier layer 304. The middle barrier layer 304 prevents tunneling of electrons from the contact layer 308 to the conduction band of the photon-absorbing layer 302. The contact layer 308 acts as a contact for biasing the device. The contact layer 308 is biased negative with respect to the photon absorbing layer 302. The valence band 312 of the intermediate layer 306 lies higher in energy than the valence band 310 of the barrier layer 304 in order to create an efficient collection of minority carriers illustrated by circles and transfer by tunneling to the p-type contact layer 308 such that a tunnel current from the contact layer 308 to the photon absorbing layer 302 is less than a dark current in the photo-detector, and the dark current from the photon-absorbing layer 302 to the middle barrier layer 304 which is (the dominant contribution to the total dark current of the photo-detector and which is) essentially diffusion limited, is due to the unimpeded flow of minority carriers, thus reducing generation-recombination (GR) noise of the photo-detector and reducing noise due to charge build-up in the barrier layer.

Figure 5B:
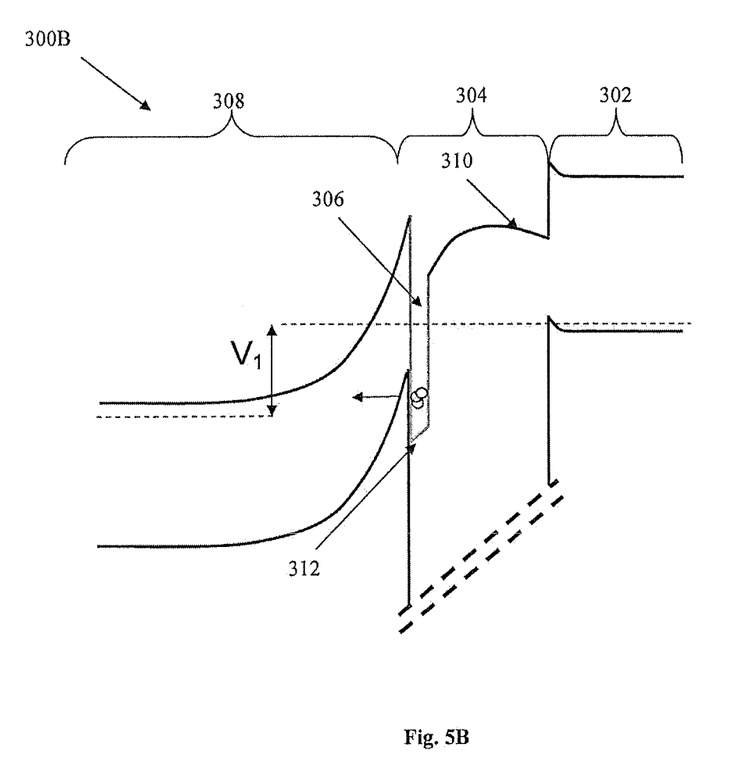
FIG. 5B shows a band diagram of the photo-detector of the present invention according to the embodiment of FIG. 5A in which the polarity is reversed.

FIG. 5B exemplifies a band diagram of this photo-detector of the present invention, in which the doping polarities of the photon absorbing, barrier 302 and contact layers 308 have been reversed compared with the embodiment in FIG. 5A, and where most of the band offset between the barrier layer and photon absorbing layer is now in the valence band. In this case minority electrons, illustrated by circles, are collected on the sub-band energy level of the intermediate layer 306 and tunnel efficiently to the conduction band of the contact layer 308.

The photo-detector 300B comprises an n-type contact layer 308 and a p-type photon-absorbing layer 302 surrounding a middle barrier layer 304. The p-type photon absorbing layer 302 has a narrow energy bandgap selected for its cut-off wavelength and absorbs the radiation impinged on the photo-detector. The energy bandgap of the p-type photon absorbing layer 302 is narrower than that of the middle barrier layer 304. The middle barrier layer 304 prevents tunneling of carriers from the contact layer 308 to the photon-absorbing layer 302. The contact layer 308 acts as a contact for biasing the device. The contact layer 308 is biased positive with respect to the photon absorbing layer 302. The conduction band 312 of the intermediate layer 306 lies lower in energy than the conduction band 310 of the barrier layer 304 in order to create an efficient collection of minority carriers illustrated by circles and transfer by tunneling to the n-type contact layer 308 such that a tunnel current from the contact layer 308 to the photon absorbing layer 302 is less than a dark current in the photo-detector and the dark current from the photon-absorbing layer 302 to the middle barrier layer 304 which is (the dominant contribution to the total dark current of the photo-detector and which is) essentially diffusion limited, is due to the unimpeded flow of minority carriers, thus reducing generation-recombination (GR) noise of the photo-detector and reducing noise due to charge build-up in the barrier layer.

The invention claimed is:

1. A photo-detector having pixels comprising:
    a p-type photon absorbing layer of a first energy bandgap on top of which are located in the following order;
    a barrier layer;
    an intermediate layer being a semiconductor structure having a second energy bandgap; and
    a contact layer of a third energy bandgap;
    wherein said pixels are fabricated by etching mesas at least through said contact layer and said intermediate layer, each pixel being formed of a mesa having side walls and edges of said intermediate layer in a pixel are exposed at the mesa side walls;
    wherein layer materials are selected such that the first energy bandgap of the photon absorbing layer is narrower than that of said barrier layer; and
    wherein the material composition and thickness of said intermediate layer are selected such that the conduction band of the intermediate layer lies below the conduction band in the barrier layer in order to trap minority carriers passing from the barrier layer and transfer the trapped minority carriers to the contact layer, a dark current from the photon-absorbing layer to said barrier layer being diffusion limited and the dark current being due to the unimpeded flow of minority carriers, thus reducing generation-recombination (GR) noise of the photo-detector.

2. A photo-detector according to claim 1, wherein said intermediate layer comprises a sub-band energy level that lies lower in energy than the conduction band of the barrier layer such that minority carriers created in the photon absorbing layer are collected on said sub-band energy level.

3. A photo-detector according to claim 1, wherein the barrier layer is p-type so that the detector is configured and operable to prevent creation of a depletion region in said photon absorbing layer when an operating bias is applied across the detector.

4. A photo-detector according to claim 1, wherein the barrier layer is intrinsic or n-type and the contact layer is p-type so that the detector is configured and operable at close to zero bias whereby a diffusion current is greater than a GR current of minority carriers flowing from the photon absorbing layer to the barrier layer and is also greater than any opposing current due to minority carriers thermally created in the contact layer.

5. A photo-detector according to claim 1, wherein said material composition and thickness of said intermediate layer are selected such that said intermediate layer prevents current flow from said contact layer to said photon absorbing layer while promoting flow of minority carriers from said photon absorbing layer to said contact layer.

6. A photo-detector according to claim 1, wherein said contact layer is made of one of: a $Ga_y In_{1-y} As_{1-x} Sb_x$ alloy, a $Ga_{y1} In_{1-y1} As_{1-x1} Sb_{x1}/Ga_{y2} In_{1-y2} As_{1-x2} Sb_{x2}$ superlattice, a $Ga_z Al_{1-z} Sb_{1-w} As_w$ alloy, and a $Ga_{z1} Al_{1-z1} Sb_{1-w1} As_{w1}/Ga_{z2} Al_{1-z2} Sb_{1-w2} As_{w2}$ superlattice with values for the indices which lie in the ranges $0 \leq x \leq 1$, $0 \leq_{x1} \leq 1$, $0 \leq_{x2} \leq 1$, $0 \leq y \leq 1$, $0 \leq_{y1} \leq 1$, $0 \leq_{y2} \leq 1$, $0 \leq z \leq 1$, $0 \leq z_1 \leq 1$, $0 \leq z_2 \leq 1$, $0 \leq w \leq 1$, $0 \leq w_1 \leq 1$, $0 \leq w_2 \leq 1$.

7. A photo-detector according to claim 1, wherein said photon absorbing layer is made of one of a $Ga_y In_{1-y} As_{1-x} Sb_x$ alloy or a $Ga_{y1} In_{1-y1} As_{1-x1} Sb_{x1}/Ga_{y2} In_{1-y2} As_{1-x2} Sb_{x2}$ superlattice with values for the indices of $0 \leq x \leq 1$, $0 \leq x_1 \leq 1$, $0 \leq x_2 \leq 1$, $0 \leq y \leq 1$, $0 \leq y_1 \leq 1$, $0 \leq y_2 \leq 1$.

8. A photo-detector according to claim 1, wherein said barrier layer is made of one of $Ga_z In_y Al_{1-z-y} Sb_{1-w} As_w$ alloy or a $Ga_{z1} In_{y1} Al_{1-z1-y1} Sb_{1-w1} As_{w1}/Ga_{z2} In_{y2} Al_{1-z2-y2} Sb_{1-w2} As_{w2}$ superlattice with values for the indices of $0 \leq z \leq 1$, $0 \leq z_1 \leq 1$, $0 \leq z_2 \leq 1$, $0 \leq y \leq 1$, $0 \leq y_1 \leq 1$, $0 \leq y_2 \leq 1$, $0 \leq w \leq 1$, $0 \leq w_1 \leq 1$, $0 \leq w_2 \leq 1$.

9. A photo-detector according to claim 1, wherein said intermediate layer is made of $In_{1-s-t} Ga_t Al_s As_v Sb_{1-v}$, with $0 \leq s \leq 1$, $0 \leq t \leq 1$, $0 \leq v \leq 1$.

10. A photo-detector according to claim 1, wherein the thickness of said intermediate layer is selected to be in the range of about 50-200 A.

11. A photo-detector according to claim 1, wherein each of said photon absorbing layer and said contact layer has a thickness in the range of about 0.1-10 μm.

12. A photo-detector according to claim 1, wherein the photon absorbing layer has a doping in the range of $5 \times 10^{14}$ cm$^{-3}$ $<p<5 \times 10^{16}$ cm$^{-3}$ and the contact layer has a doping in the range of $5 \times 10^{14}$ cm$^{-3}<p<5 \times 10^{18}$ cm$^{-3}$.

13. A photo-detector according to claim 1, wherein said barrier layer has a thickness of between 0.05 and 1 μm.

14. A photo-detector according to claim 1, wherein said barrier layer is p-type and is doped in the range of $p<1 \times 10^{17}$ acceptors cm$^{-3}$.

15. A photo-detector according to claim 1, wherein said barrier layer is n-type and is doped in the range of with $n<1 \times 10^{16}$ cm$^{-3}$.

16. A photo-detector according to claim 1, wherein the contact layer has a doping in the range of $5 \times 10^{14}$ cm$^{-3}<p<5 \times 10^{18}$ cm$^{-3}$.

17. A photo-detector according to claim 1, wherein the contact layer is n-type such that the transfer of minority carriers from the intermediate layer to the contact layer is performed by tunneling.

18. An array of detectors in which each detector is in accordance with claim 1 and which is connected to a silicon readout circuit by an indium bump.

* * * * *